US010504607B1

(12) United States Patent
Gregor et al.

(10) Patent No.: US 10,504,607 B1
(45) Date of Patent: Dec. 10, 2019

(54) MULTIPLE-CHANNEL, PROGRAMMABLE FUSE CONTROL UNIT

(71) Applicant: Cadence Design Systems, Inc., San Jose, CA (US)

(72) Inventors: Steven Lee Gregor, Oswego, NY (US); Puneet Arora, Noida (IN); Norman Robert Card, Vestal, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 11 days.

(21) Appl. No.: 15/719,916

(22) Filed: Sep. 29, 2017

(51) Int. Cl.
| G11C 29/00 | (2006.01) |
| G11C 29/44 | (2006.01) |
| G11C 17/18 | (2006.01) |
| G11C 17/16 | (2006.01) |

(52) U.S. Cl.
CPC .......... *G11C 29/4401* (2013.01); *G11C 17/16* (2013.01); *G11C 17/18* (2013.01)

(58) Field of Classification Search
CPC ...... G11C 29/4401; G11C 17/16; G11C 17/18
See application file for complete search history.

(56) References Cited

U.S. PATENT DOCUMENTS

| 2002/0122341 A1* | 9/2002 | Perner ................ G11C 29/4401 |
| | | 365/200 |
| 2013/0227344 A1* | 8/2013 | Sohn ....................... G06F 11/27 |
| | | 714/6.21 |

* cited by examiner

*Primary Examiner* — Samir W Rizk
(74) *Attorney, Agent, or Firm* — Tarolli, Sundheim, Covell & Tummino LLP

(57) ABSTRACT

An exemplary fuse control arrangement can be provided, which can include, for example, a fuse control unit(s), which includes a test access method interface(s) and a programmable memory(ies), wherein the fuse control unit(s) is configured to provide fuse information to repair a memory (ies). The fuse control unit(s) can be coupled to the memory (ies) and the memory(ies) can be coupled to a register repair unit(s). The fuse control unit(s) can provide the register repair unit(s) with the fuse information to repair the memory (ies).

23 Claims, 9 Drawing Sheets

MULTIPLE-CHANNEL, PROGRAMMABLE FUSE CONTROL UNIT

FIELD OF THE DISCLOSURE

The present disclosure relates generally to fuse control units, and more specifically, to exemplary multiple-channel, programmable fuse control units.

BACKGROUND INFORMATION

Embedded memories may consume 50% or more of a die area, which is expected to increase in the coming years. Although care is taken when designing and fabricating a memory, the memory may still require repairs after the memory has been fabricated. In order to repair a memory after it has been fabricated, one or more fuses may be used. However, it may be difficult to determine which fuses should be applied to particular memories. Additionally, reading fuses may be a slow process, and fuses take up a substantial amount of space. Some previous work has been performed to facilitate parallel access to the fuses. Yet, fuses are still fused one at a time (e.g., blown). Fuses generally start out at logic 0, and a high voltage, for a specified period of time, is required to change the fuse to a logic 1 (e.g., burn the fuse). However, it may be difficult to easily determine which fuses should be applied to repair which memories. Further, it may be difficult to relay the needed information about the specific fuses to a repair unit that will repair the memory.

Thus, it may be beneficial to provide an exemplary multiple-channel, programmable fuse control unit, which may overcome at least some of the deficiencies presented herein above.

SUMMARY

An exemplary memory arrangement may be provided, which may include, for example, memory(ies), a repair register unit(s) (RRUs) coupled to the memory(ies), and a fuse control unit(s) (FCUs) coupled to the RRU(s), where the FCU is configured to provide the RRU(s) with fuse information to repair the memory(ies). The FCU(s) may be further coupled to a fuse array(s), and the fuse information may include information about locations of a plurality of fuses in the fuse array. The FCU(s) may be configured to provide the RRU with the fuse information using a serial interface or a parallel interface.

In some exemplary embodiments of the present disclosure, the FCU(s) may include a non-volatile storage arrangement(s) configured to store the fuse information. The RRU(s) may include a plurality of RRUs, and the FCU(s) may be configured to provide the fuse information to the RRUs using a ring shift procedure. The RRUs may be coupled to one another.

An exemplary system, method, and computer-accessible medium for repairing a memory(ies) may be provided, which may include, for example, determining error(s) in the memory(ies) using a repair register unit(s) (RRUs), determining a location of a fuse(s) based on the error(s) using a fuse control unit(s) (FCUs), providing the location of the fuse(s) to the RRU, repairing the memory(ies) based on the location of the fuse(s). The error(s) may be determined using a built-in self-test(s). The location of the fuse(s) may be stored in a non-volatile storage arrangement coupled to the FCU(s).

In certain exemplary embodiments of the present disclosure, the memory(ies) may include a plurality of memories and the RRU(s) may include a plurality of RRUs, where each of the RRUs may be associated with at least one of the plurality of memories. The RRUs may be coupled to one another using a serial interface. The exemplary system, method, and computer-accessible medium may further include, determining particular error(s) for each of the memories, determining a location of the fuse(s) for each of the memories using the FCU(s) based on the particular error(s), providing the location of the fuse(s) to the RRUs, and repairing the memories based on the location of the particular fuse(s). The location of the fuse(s) may be provided to the RRUs in a serial manner using the FCU(s). The location of the fuse(s) may be ring shifted through the RRUs.

In some exemplary embodiments of the present disclosure, the memories may be repaired using the RRU(s) based on the location of the associated fuses. Each of the associated fuses may be set to a logic 1. Information pertaining to the fuse array may be received, which may be used to program the FCU(s). The location of the associated fuses may be provided to the RRU(s) using a ring shift procedure.

A further exemplary fuse control arrangement can be provided, which can include, for example, a fuse control unit(s), which includes a test access method interface(s) and a programmable memory(ies), wherein the fuse control unit(s) is configured to provide fuse information to repair a memory(ies). The fuse control unit(s) can be coupled to the memory(ies) and the memory(ies) can be coupled to a register repair unit(s). The fuse control unit(s) can provide the register repair unit(s) with the fuse information to repair the memory(ies).

A further exemplary memory arrangement can be provided, which can include, for example, a memory(ies), and a fuse control unit(s) wherein the fuse control unit(s) includes a programmable memory(ies).

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which.

Figure 1:
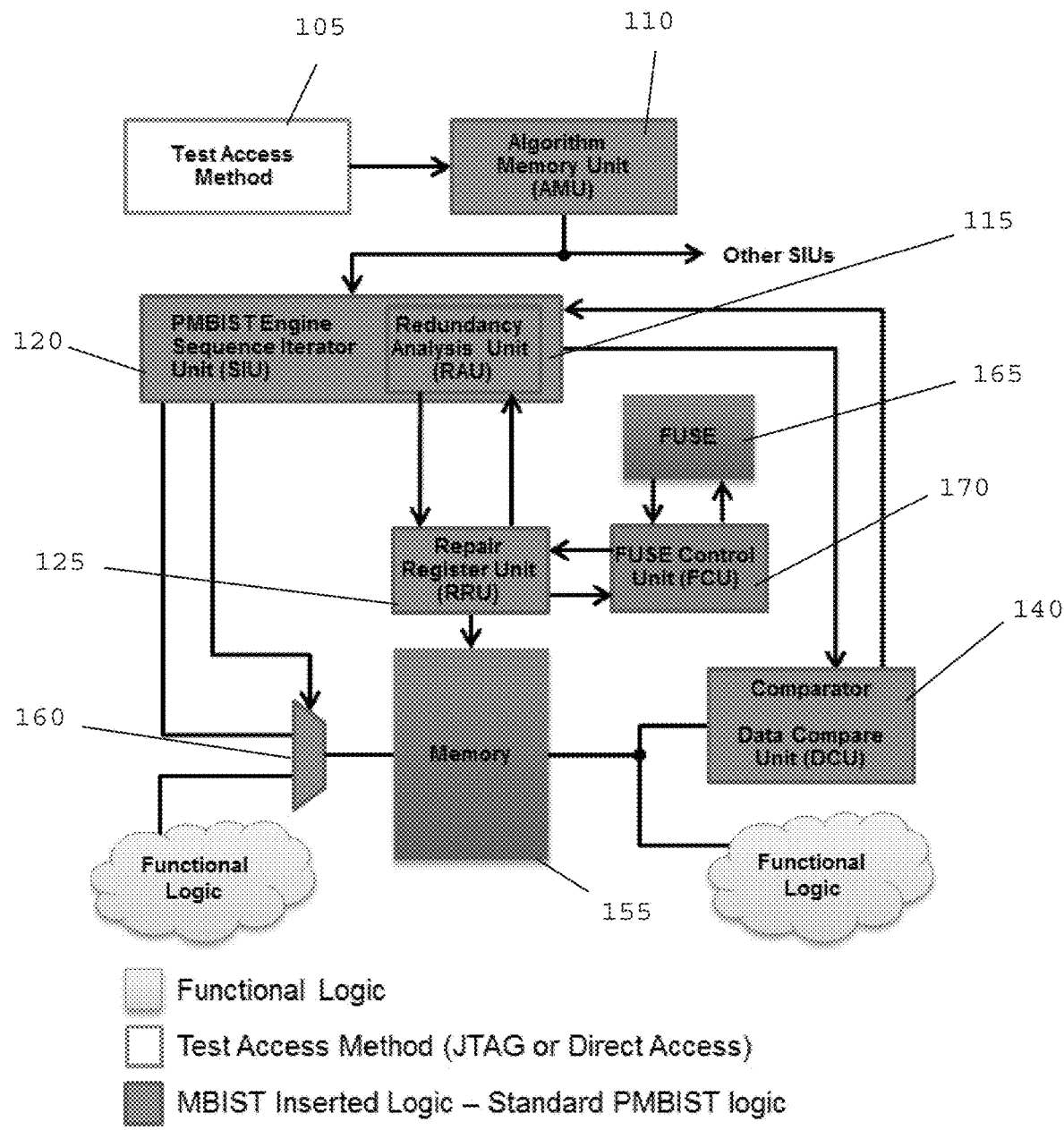
FIG. 1 is an exemplary schematic diagram of an exemplary fuse control unit used in conjunction with a repair register unit and a memory according to an exemplary embodiment of the present disclosure.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures and the appended claims.

DETAILED DESCRIPTION OF EXEMPLARY EMBODIMENTS

Exemplary embodiments of the present disclosure may include a fuse control unit ("FCU"), which may be used to fix, or store fixes, or for a memory. The exemplary FCU may support various exemplary configurations. For example, a single FCU may be used, or multiple FCUs may be used or incorporated, which may be used to store fixes for a memory. The exemplary FCU may be power domain ("PD") aware, which may be inherited by the FCU during the insertion, if an annotated module is present.

Each exemplary FCU may contain one or more concurrent repair channels. The exemplary FCU may support one or more data bit transfers per cycle, and may be clock domain aware using, for example, a register repair unit ("RRU") and/or non-volatile memory ("NVM"). The use of concurrent repair channel may facilitate access to the NVM. The NVM word width and number of repair channels may result in a particular repair channel word width. A serial repair channel may be used to bind to NVM row addresses, where fixed NVM word subsets may bind to repair channels. In some exemplary embodiments of the present disclosure, non-uniform repair channels connected or bound to the NVM, may be used and/or incorporated.

The exemplary FCU may include one or more repair tokens, which may include logical repair encoding, which may be provided to the RRU, for repairing the memory. The repair tokens may minimize token NVM storage requirements, and may be independent of memory's physical repair interface requirements (e.g., RRU translates). Repair tokens may be fixed in size or variable in size. The variability of the size of the repair token may be a function of each RRU instance's requirements, and may be used to minimize overall NVM storage use. RRU+RRX tagging, as well as a register repair channel ("RRC") value, may facilitate more efficient multiple pass support. When a RRU equals 0, this may imply an invalid token. If the RRU is a non-zero value, this may imply a valid token.

The exemplary FCU may provide e-fuse fault tolerance support. Reliability may be a factor in whether e-fuse redundancy is needed, and how it may be implemented. For example, with a confirmed write procedure, after an e-fuse solution write, e-fuses may be reread to compare them against RRU stored solutions. Multiple passes may be needed in order to confirm all entries with a count that may be used to indicate total repairs. If a bad entry is detected during a compare procedure, rewriting the token to an alternate location may be possible, which may utilize another rotate pass, or post overflow and error out. This exemplary approach may be sufficient if blown e-fuses do not degrade over time.

The exemplary e-fuse may utilize two e-fuses per bit implementation. A parity token may be used, as well as an error correction code ("ECC") parity per token/word. The use of an e-fuse may facilitate the use of redundant resources, and known un-programmed state tests (e.g., where all zeroes are initially verified). Exemplary e-fuse access rate may dependent on the write procedure and read procedure. For example, for a write and a read procedure, rates may depend on the word width and operation duration. The read/write procedures may limit the per e-fuse bit that is used.

FIG. 1 illustrates an exemplary test access method ("TAM") 105 for a memory with a PMBIST, a FCU, and a Fuse array, according to an exemplary embodiment of the present disclosure. TAM 105 may interface with algorithmic memory unit ("AMU") 110. AMU 110 may be compiled with various user-defined algorithms, which may be used to test the memory unit. AMU 110 may be shared across multiple sequence iterator unit ("SIU") (e.g., PMBIST Engine SIU 120) or other SIUs. The size of AMU 110 may be adjusted during compile time, and it may include a selection of testplans. Additionally, AMU 110 may function across a number of clock domains.

PMBIST Engine SIU 120 may include logic for a configurable and optimized address generation, control signal interface, and data background generation. It may include a single sequence iterator shift register and control logic utilized to execute the commands in the sequence iterator once initiated. PMBIST Engine SIU 120 may interface with data compare unit ("DCU") 140, which may be shared across different types of memories. DCU 140 may determine failures by comparing data read from memory with expected values from a test algorithm. The signal from the comparator may indicate when a miscompare has occurred.

A RRU 125 may be assigned to each repairable memory or solution group (e.g., for memory 155). PMBIST Engine SIU 120 may also interface directly with memory 155 thorough multiplexer 160. FCU 170 may connect directly to one or more fuses 165, and may provide information to the RRU regarding fuses in fuse array 165, which may be used to repair memory 155.

Redundancy Analysis Unit ("RAU") 115 may perform logical analysis, and may determine a repair solution for the memory. The RAU may feed the solution to the RRU, which may use it to generate needed information to repair memory (e.g., transform it to a physical solution to be applied to the memory to fix the memory). The FCU may include NVM that has hardwired repair locations for the memory. The FCU is provided with the repair information, and then may read all of the fuses, and distribute the available fuses out to the memories that need the fuse information. The exemplary FCU may create a set of channels where information may be sent out serially to the RRUs.

The repair channels may have multiple RRUs in series, which may each have one or more repair tokens which may applied to the memory the RRU is connected with (e.g., the memory the RRU talks to). The FCU may be responsible for storing information in such a way that FCU knows where to place repair tokens (e.g., in which RRU). Once a repair token is placed in the RRU, it may be applied to the memory associated with the RRU.

Information provided from the FCU to the RRU may be sent serially (e.g., using a ring shift). The FCU may be aware of the number of RRUs present, and in the order the RRUs are relative to the other RRUs (e.g., the FCU may know which RRU is first, which is last, etc.). Thus, the FCU may transfer the data for all RRUs in a single communication signal, by shifting the data for each RRU through the RRUs. Once the signal from the FCU is fully transmitted, each RRU, by shifting from the previous RRU, may have the information needed only for that RRU. Thus, the FCU may know where to put information for each RRU in the signal (e.g., the precise location in the signal).

The exemplary FCU may facilitate multiple types of repair functions. An exemplary hard repair function may be as follows. When initially testing the memory (e.g., for the first time), target devices may be identified, and a set of patterns may be run on the memory (e.g., the memory may be tested). A determination may then be made if a set of repairs is needed to be performed in an SIU. If so, this information may then be transferred to the RRU. The RRU may apply the repair information to the memory (e.g., which may include multiple fuses and their locations). The memory may then be retested to determine if the repair was performed successfully. Once all of the repairs are successfully performed and tested, information from within the RRUs may be shifted back into the FCU, which may then be written into the fuse bank (e.g., NVM), and committed to the fuse array. Any time the chip is then powered on (e.g., after the initial test procedure) the information in the FCU regarding the fuses used to repair the memory may be shifted into the RRUs, and the RRUs may apply the fuse information to its respective memory.

A soft repair may be formed at a later time if there are additional resources available (e.g., if there are additional fuses available that were not used during the hard repair). For example, each time the chip is powered on, a further test may be performed on the memory (e.g., the additional repairs are stored only in the RRUs and do not come from the eFuses). If there are additional memory failures, the available resources may be applied to repair the memory (e.g., the location of additional fuses that may be available and applied to the memory).

Different semiconductor manufacturers may utilize different fuse arrays, which may be implemented differently by each manufacturer. Some fuse arrays are sophisticated, including built-in self-tests in the fuse arrays. Due to the variability in fuse arrays, it may be resource intensive to program each FCU for each chip manufacturer. In order to overcome this problem, the exemplary FCU may be programmed by the user depending on the user's specific fuse array. The grammar that is normally used for a BIST may be extended to the exemplary FCU. Thus, a user may define registers in the FCU that the user wants to read and write, and the user may define durations through testplan definitions such that the fuse management may be created by the end user simply by having knowledge of what their own fuses look like. Thus, each FCU may be configured by the chip manufacturer, and may be specific to that chip manufacturer, depending on the fuse array used.

Exemplary Multiple-Pass Support

Each repair channel may carry a mask that may identify the mfx bit positions, and the variably-sized data width of each repair token per RRU (e.g., distance between mfx bits) created from an MBIST RRU. The access path may be consistent for a given repair channel, and repair tokens may be stored in NVM in a predefined order. Support for secondary accesses may be provided, which may identify, in the repair stream, those repair tokens which may already exist as compared to those which are new. Exemplary pre bits may be utilized in RRUs adjacent to mfx. In some exemplary embodiments of the present disclosure, it may be possible to reset the repair stream RRU mfx bits of those found in the NVM to facilitate the identification of the new repair tokens. After these new repair tokens are added to the NVM storage, all or most of the information stored in the NVM may be repopulated back into RRUs.

Figure 2:
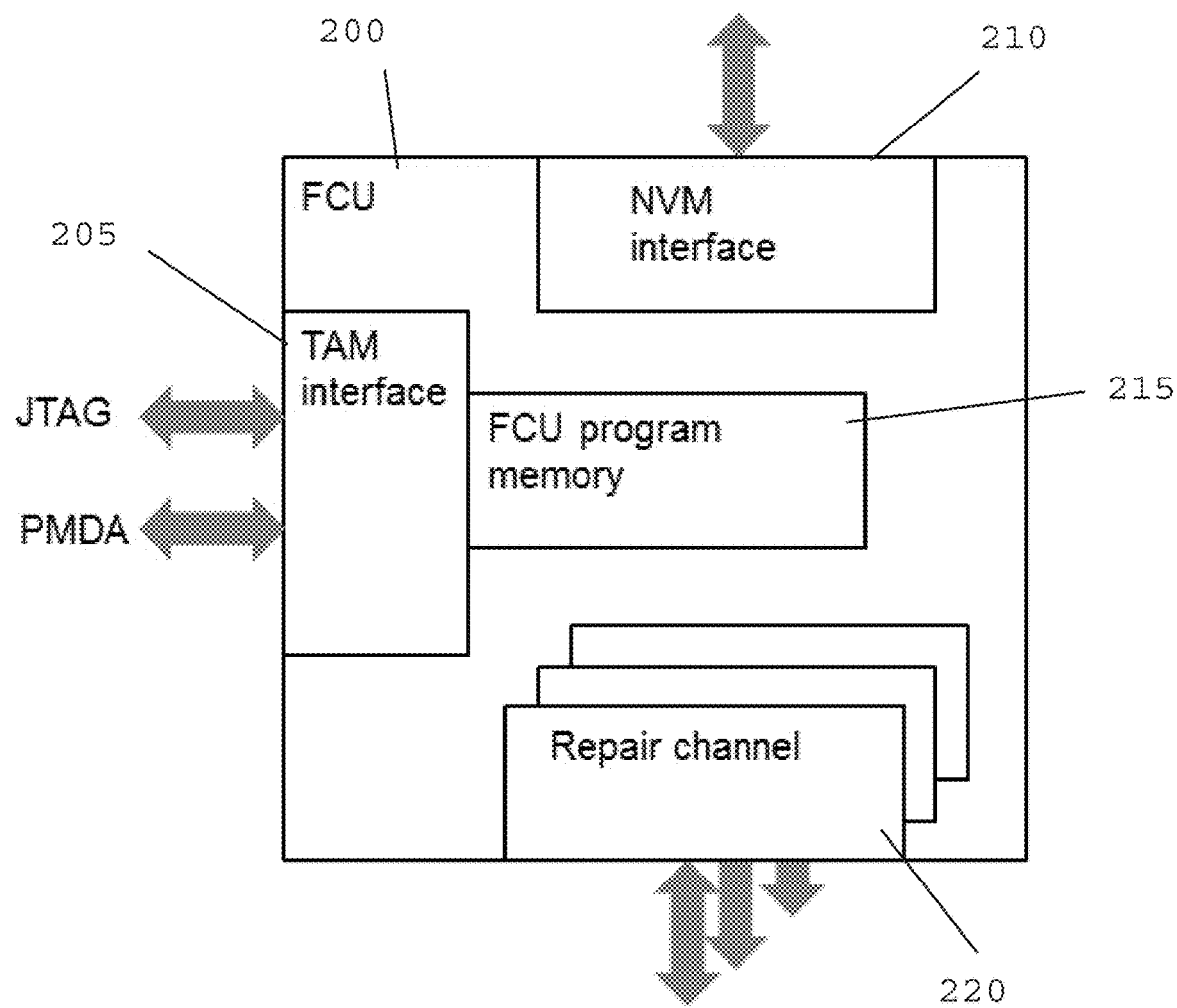
FIG. 2 is a schematic diagram of an exemplary fuse control unit according to an exemplary embodiment of the present disclosure.

FIG. 2 shows an exemplary schematic diagram of an FCU according to an exemplary embodiment of the present disclosure. For example, as shown therein, an exemplary FCU 200, which may be both power domain aware and clock domain aware, may be hardwired/TAM-loaded program memory through a TAM interface 205, which may facilitate access to the FCU program memory 215. The exemplary FCU 200 may be externally controlled (e.g., using a Joint Test Action Group ("JTAG") controller and/or programmable MBIST direct access ("PMDA") controller). An exemplary NVM interface 210 may support connection to multiple non-volatile memories. One or more concurrent repair channels 220 may facilitate the exemplary FCU 200 to be both power domain aware and clock domain aware, as well as facilitating the exemplary FCU 200 to support multiple pass repairs and an n-data bit interface to RRUs.

The JTAG controller and/or PMDA controller may be used to control transfers between FCU operations and PMBIST operations. The exemplary FCU 200 may facilitate the validation of unwritten e-fuse states prior to use. Exemplary RRU solutions may be compared to written e-fuse solutions. For the exemplary RRU operations, RRU values may be propagated to the memory at the end of every rotate in the RRU.

Exemplary FCU-RRU Hard Repair Interface ("HRI")

To enable third party FCU attachment, a serial interface may be added that may facilitate interaction with the RRU through a labeled repair channel. The external FCU may be responsible for managing the e-fuses and distribution to and from the RRUs. The may be accomplished utilizing the PMBIST, which may be inserted with a soft repair and may enable_hri selected. This may also be accomplished with a selected hard repair.

Figure 3:
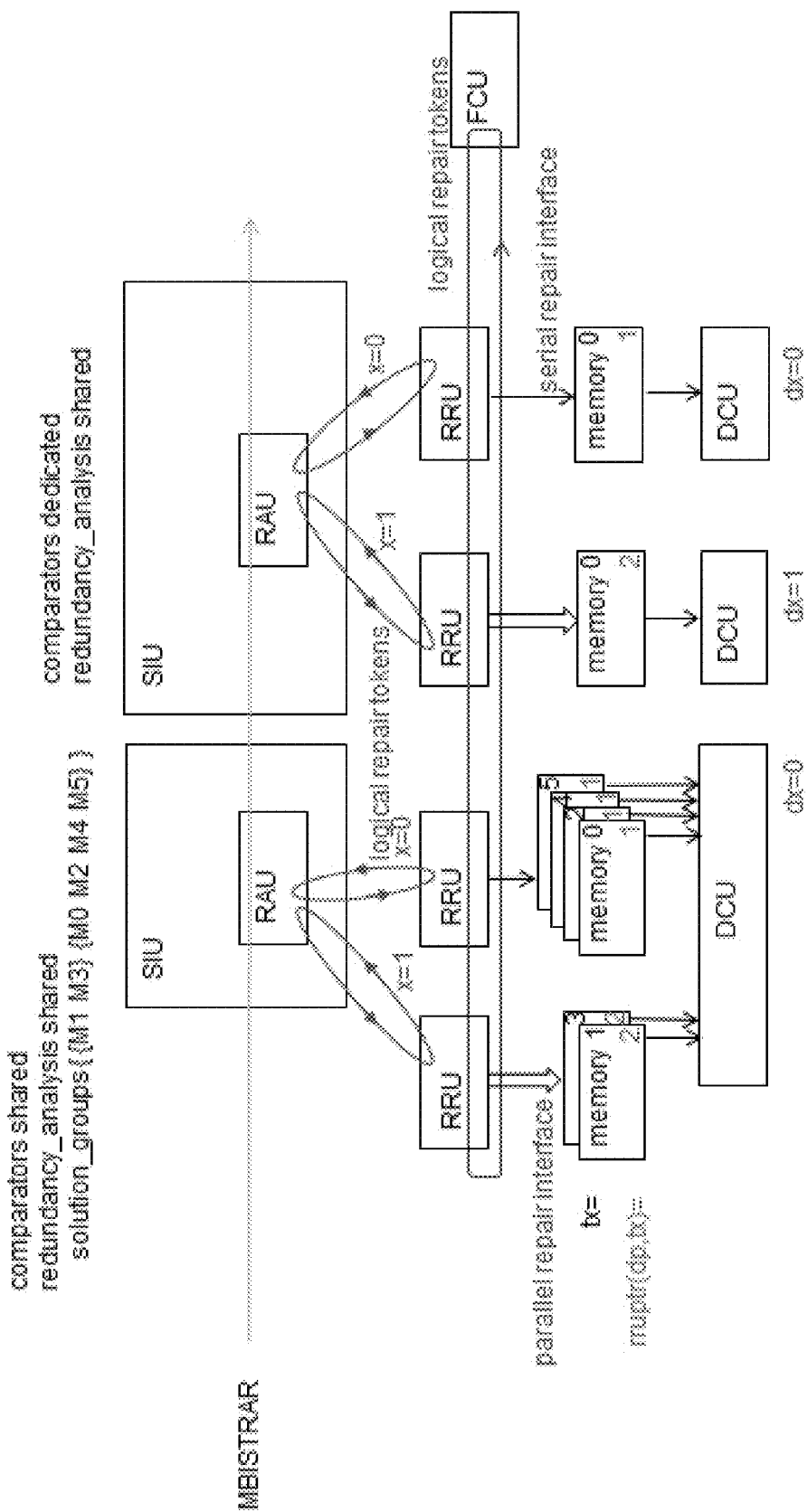
FIG. 3 is a schematic diagram of the exemplary fuse control unit interfaced with a plurality of register repair units using a serial or a parallel interface according to an exemplary embodiment of the present disclosure.
Figure 4:
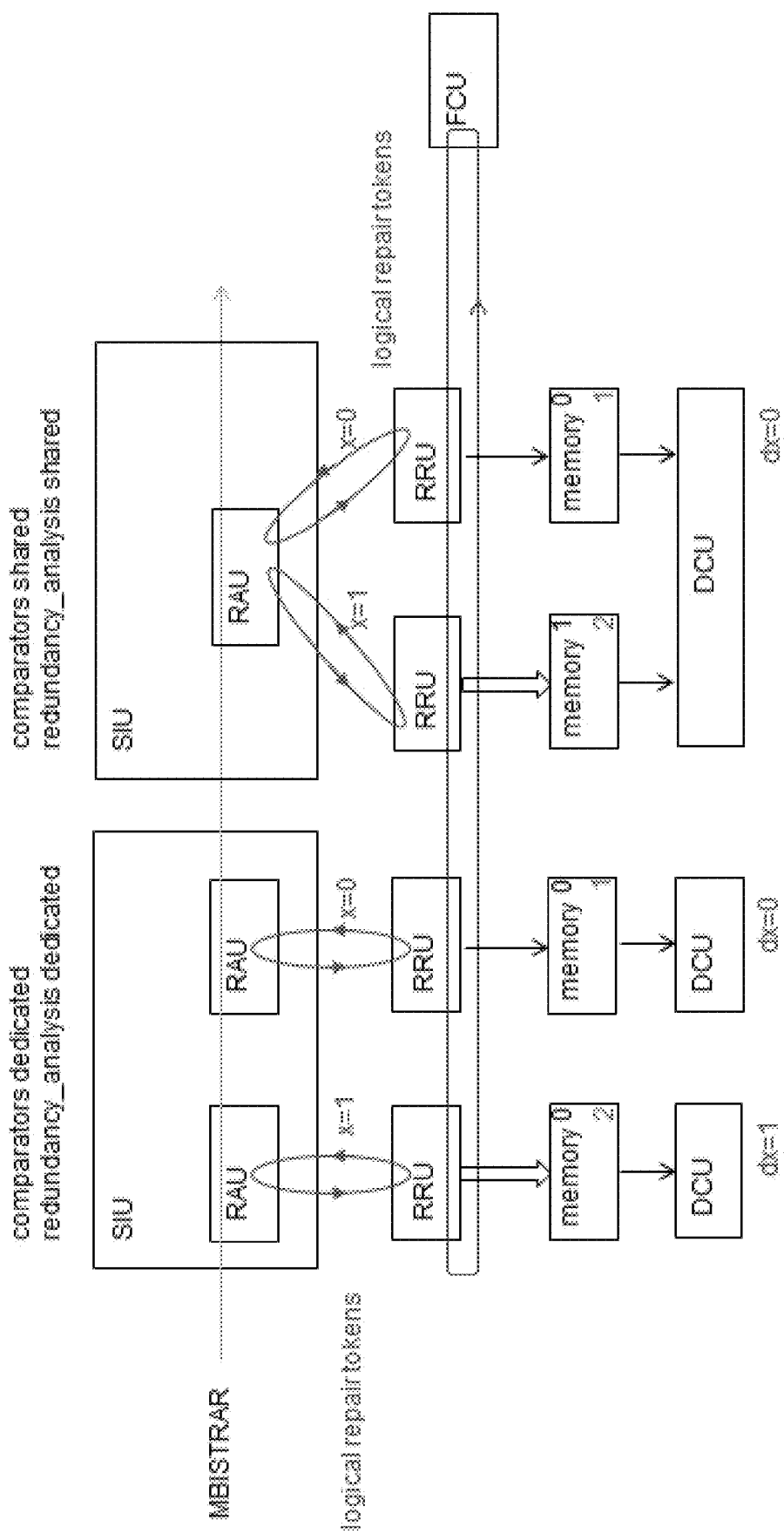
FIG. 4 is a schematic diagram of the exemplary fuse control unit providing logical repair tokens to a plurality of register repair units according to an exemplary embodiment of the present disclosure.

FIG. 3 is a schematic diagram of the exemplary fuse control unit interfaced with a plurality of RRUs using a serial or a parallel interface according to an exemplary embodiment of the present disclosure. FIG. 4 is a schematic diagram of the exemplary fuse control unit providing logical repair tokens to a plurality of RRUs according to an exemplary embodiment of the present disclosure. The connection to multiple RRUs may facilitate a hard repair interface from the FCU. A combination of hard repair and soft repair may be used. This may facilitate the FCU to load hard repair solutions into repair registers prior to MBIST redundancy analysis.

Exemplary FCU-RRU HRI Signals

The exemplary FCU to RRU signal transfer may be temfcu_active (e.g., a n-pipelined broadcast). Signals may be active high during the course of any ring shift data transfer between the FCU and the RRU repair channel. The temfcu_transfer (e.g., also a n-pipelined broadcast), may include an active high indication when valid data are on the interface. This may facilitate data transfers to be interrupted for FCU internal processing. The temfcu_rdi (e.g., an m-pipelined daisy-chain), may be a vector if a parallel interface is utilized. The exemplary RRU to FCU signal transfer may be temfcu_rdo (e.g., an m-pipelined daisy-chain), which may be sized similar to, or identical to, temfcu_rdi. A shared clock (e.g., fcu_clk), may vary from repair channel to repair channel, but may be common on both ends of any individual RRU to FCU repair channel.

Exemplary FCU-RRU HRI Repair Channel Structure

Figure 5:
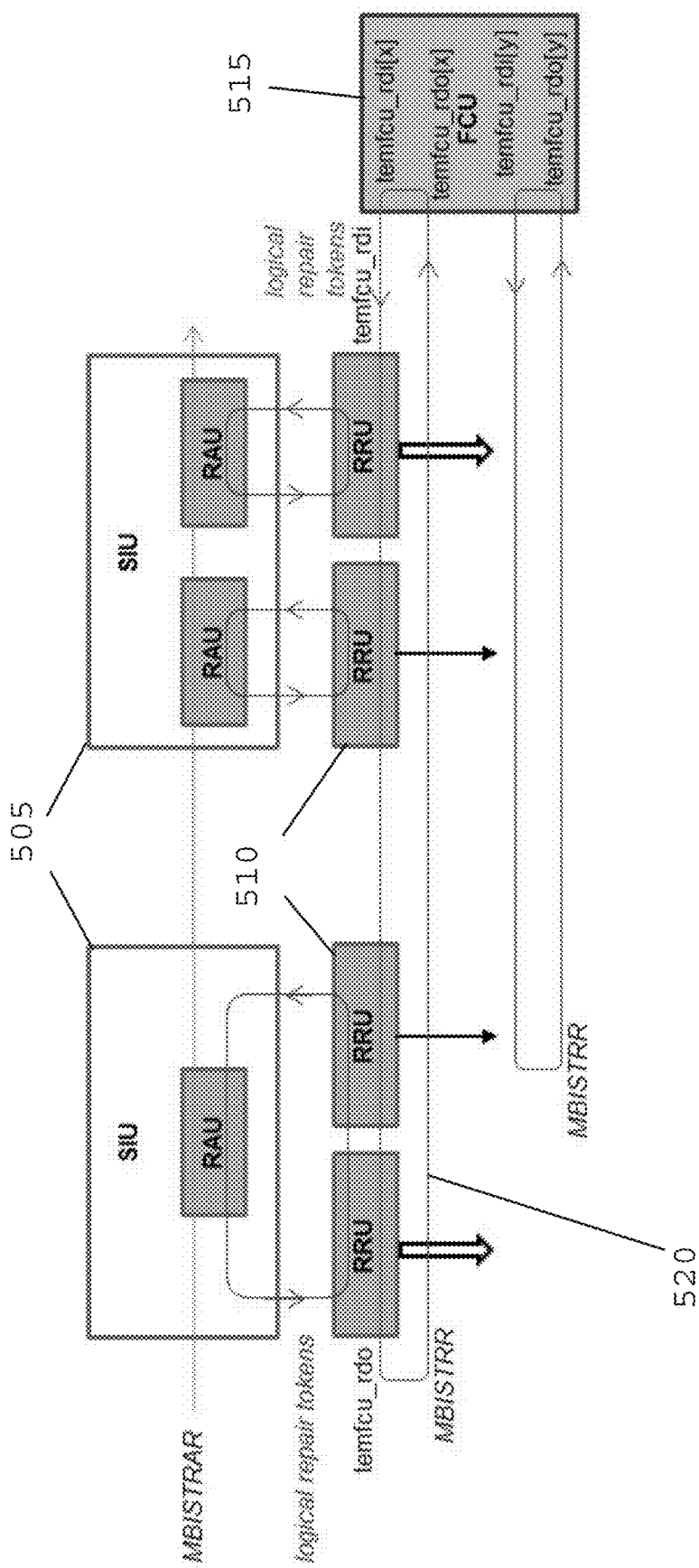
FIG. 5 is a further schematic diagram of the exemplary fuse control unit providing logical repair tokens to a plurality of register repair units according to an exemplary embodiment of the present disclosure.

FIG. 5 shows a schematic diagram of the repair channel structure for two sequence iterator units ("SIU") 505 according to an exemplary embodiment of the present disclosure. The exemplary FCU 515 may push data out on temfcu_rdi[x] to a series of RRUs 510 interconnected via a temfcu_rdi/temfcu_rdo daisy chain 520. The exemplary FCU 515 may receive data on temfcu_rdo[x]. Each channel may contain a broadcast, potentially pipelined, pair of control signals from FCU 515 to RRUs 510 within the channel (e.g., temfcu_active[x] and temfcu_transfer[x]).

Exemplary FCU-RRU HRI Repair Channel Timing

Figure 6:
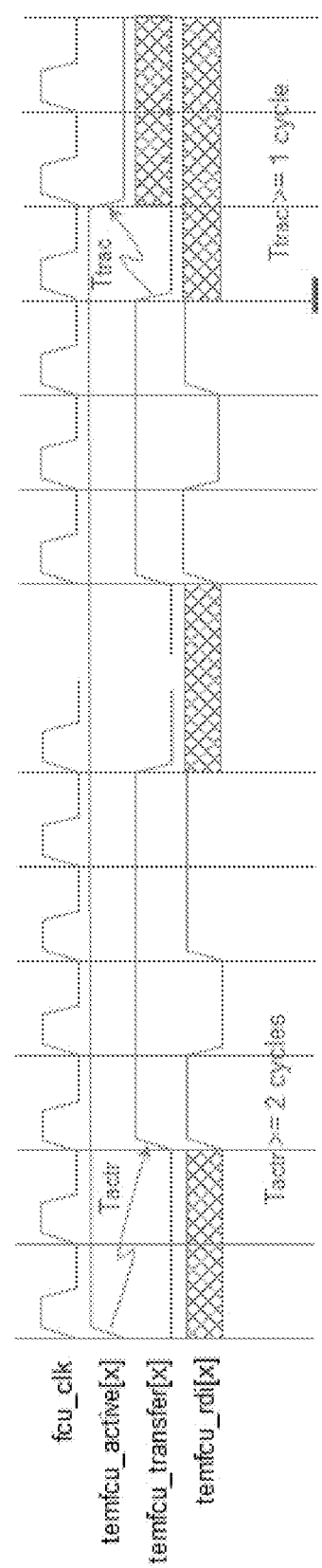
FIG. 6 is an exemplary timing diagram of the repair channel timing for the exemplary fuse control unit according to an exemplary embodiment of the present disclosure.

FIG. 6 shows a timing diagram of the repair channel timing for the exemplary FCU according to an exemplary embodiment of the present disclosure. The temfcu_active[x] may be an active high signal, which may remain active for a duration of the information transfer between the FCU and the RRUs. When deasserted, the RRUs may transfer translated repair tokens from the RRU to the assigned memories. The temfcu_transfer[x] may be an active high signal, which may be asserted at each cycle when a shift of data may occur in the MBISTRR ring shift register. The fcu_clk may be a common repair channel clock, which may be positive-edge triggered.

Exemplary FCU-RRU HRI Repair Token Definition

The exemplary RRU may be assigned a single, common memory (e.g., libcell) instance set. One or more tokens per RRU may be organized in serial shift register. A logical, field encoded token structure may be used to minimize NVM requirements. Each exemplary token may contain the minimal data necessary to reflect a repair plus mfx (valid) bit. Each may be organized [m:0] with repair data in [m:1] and mfx in [0]. [0] may be closest to temfcu_rdo[x] and tokens may be variably sized within, and across, RRUs. The exemplary FCU collection of RRU repair tokens may include ring shifting data from MBISTRR on each repair channel and writing new data to NVM. The FCU may distribute hard repair information by reading NVM data, and populating the proper positions in the MBISTRR during the ring shifting operation. An exemplary design_mbistrr_fcu_map.txt file may be used, which may contain the content of all repair channels in the exemplary design.

FCU E-Fuse Operations Signals

FCU to e-fuse signals and e-fuse to FCU signals may be user-controlled definitions, and may be used use via an interface map ("IMAP")/execution register map ("XMAP").

Exemplary FCU Insertion

The Exemplary FCU may include non-volatile memories as recognized memories to the PMBIST. For e-fuse memories, suitable access features may be noted for FCU use. Extended test feature support may be provided, which may be used to enable user-programmable NVM routines to be created without passing all of this knowledge to RMV/IDPM. This may be beneficial for extensibility and long-term use. A macro view may be used to create a wrapper around the e-fuse memories. This may provide for short-term support for port_access. In some exemplary embodiments of the present disclosure, usable address_range may be constrained when e-fuses have shared functions, as opposed to just imposing an address_limit. Additional MBISTRR FCU mapping file may be utilized to track RRU contents. The RRU stitching may be deferred until FCU insertion, and may support incremental (e.g., block-level) RRU stitching via this file as well. The exemplary file may be user-modified to configure repair channels as needed based on the fuse array of the user.

Various exemplary FCU testplans may be defined. The uniqueness of NVM operations encoded within testplans using assign <signal><value>/wait <time>/wait <signal><value> instructions and port_access assign/sample statements associated with FCU targets may be used (e.g., using IMAP or XMAP registers). These registers may be embedded within the FCU algorithm memory (e.g., AMU style: hw, pgm) or encoded in the TAM sequences. Power up/down sequences may be encoded in a similar manner, differing in the voltage controls, which may be the responsibility of the user. Conditional (e.g., test <signal><value> or iterate <signal><value>) instruction support may facilitate unbounded looping and e-fuse self-repair. An FCUAMR TDR mapping file may be utilized to support programming FCU algorithm memory and TAM assign/sample registers (e.g., IMAP), but not XMAP registers. Assigns may be collected together for parallel XMAP access each cycle. Any intervening wait instruction may cause delays in XMAP accesses/transitions. The use of an IMAP for lower/upper address limit and lower/upper data bit range may be used to control e-fuse accesses.

In some exemplary embodiments of the present disclosure, an extended configuration file grammar may be used to instantiate FCU macros in a new "repair" group. This may support the specification of the following:

i) Whether FCU may be inserted or not (e.g., executing block level repair channel binding step only);
ii) FCU insertion location;
iii) the number and length of repair channels per FCU;
iv) RRU binding to repair channels (repair_channels { } specification), which may avoid number and length specification;
v) FCU binding to NVM module instances;
vi) the use of macro interface 2D structuring of physical NVM;
vii) whether the FCU testplan binding may be enabled; and
viii) the Repair channel to NVM mem X row X col binding.

The specification of the above may facilitate the insertion of FCUs and/or repair channel binding at any level in a bottom-up flow, including the top with no other MBIST logic. The exemplary configuration file may include only repair group definitions, and may be executed as a separate step even after MBIST insertion has been executed on a block.

Binding of RRUs to repair channels may be performed with use of MBISTRR FCU mapping file. If a repair channel distribution is known at block-level insertion, repair channel ports may be added or connected. Block level and integration level repair channel ids may be utilized in preconfigured blocks.

Figure 7A:
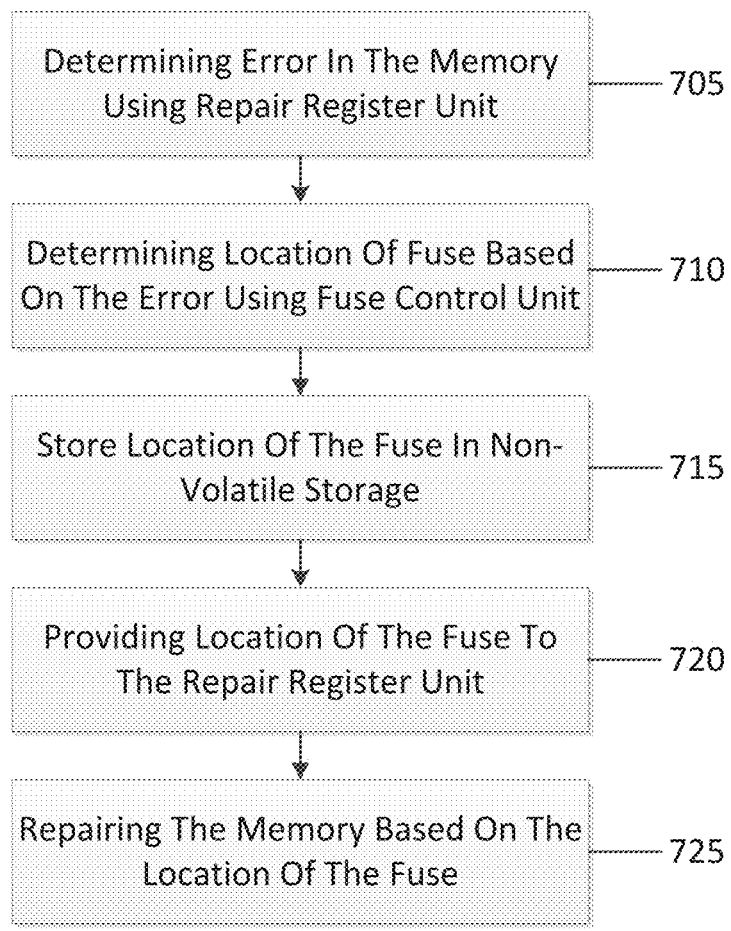
FIGS. 7A and 7B are flow diagrams of exemplary methods for repairing one or more memories according to an exemplary embodiment of the present disclosure.

FIG. 7A is a flow diagram of an exemplary method 700 and 750 for repairing a memory according to an exemplary embodiment of the present disclosure. For example, at procedure 705, an error in a memory may be determined using a repair register unit (e.g., by performing a built-in self-test). At procedure 710, the location of a fuse may be determined based on the error using a fuse control unit. The location of the fuse may be stored in a non-volatile storage arrangement at or 715. At procedure 720, the location of the fuse may be provided to the repair register unit, which may repair the memory at procedure 725 based on the location of the fuse.

Figure 7B:
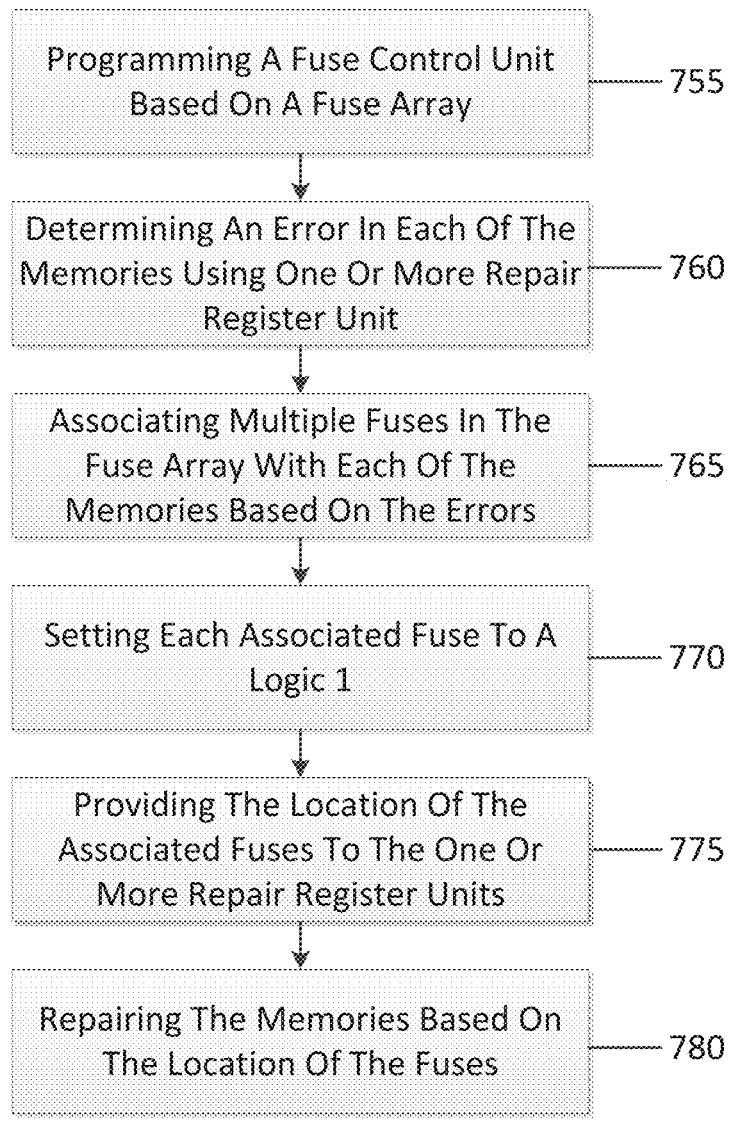

FIG. 7B is a flow diagram of an exemplary method 750 for repairing a plurality of memories according to an exemplary embodiment of the present disclosure. For example, at procedure 755, a fuse control unit may be programmed based on a fuse array (e.g., based on received information about fuses in the fuse array). At procedure 760, one or more errors in each of the memories may be determined using one or more repair register units. At procedure 765, multiple fuses in the fuse array may be associated with each of the memories based on the errors. At procedure 770, the associated fuses may be set to a logic 1. At procedure 775, the location of the associated fuses may be provided to the one or more repair register units. At procedure 780, the memories may be repaired based on the location of the fuses.

Figure 8:
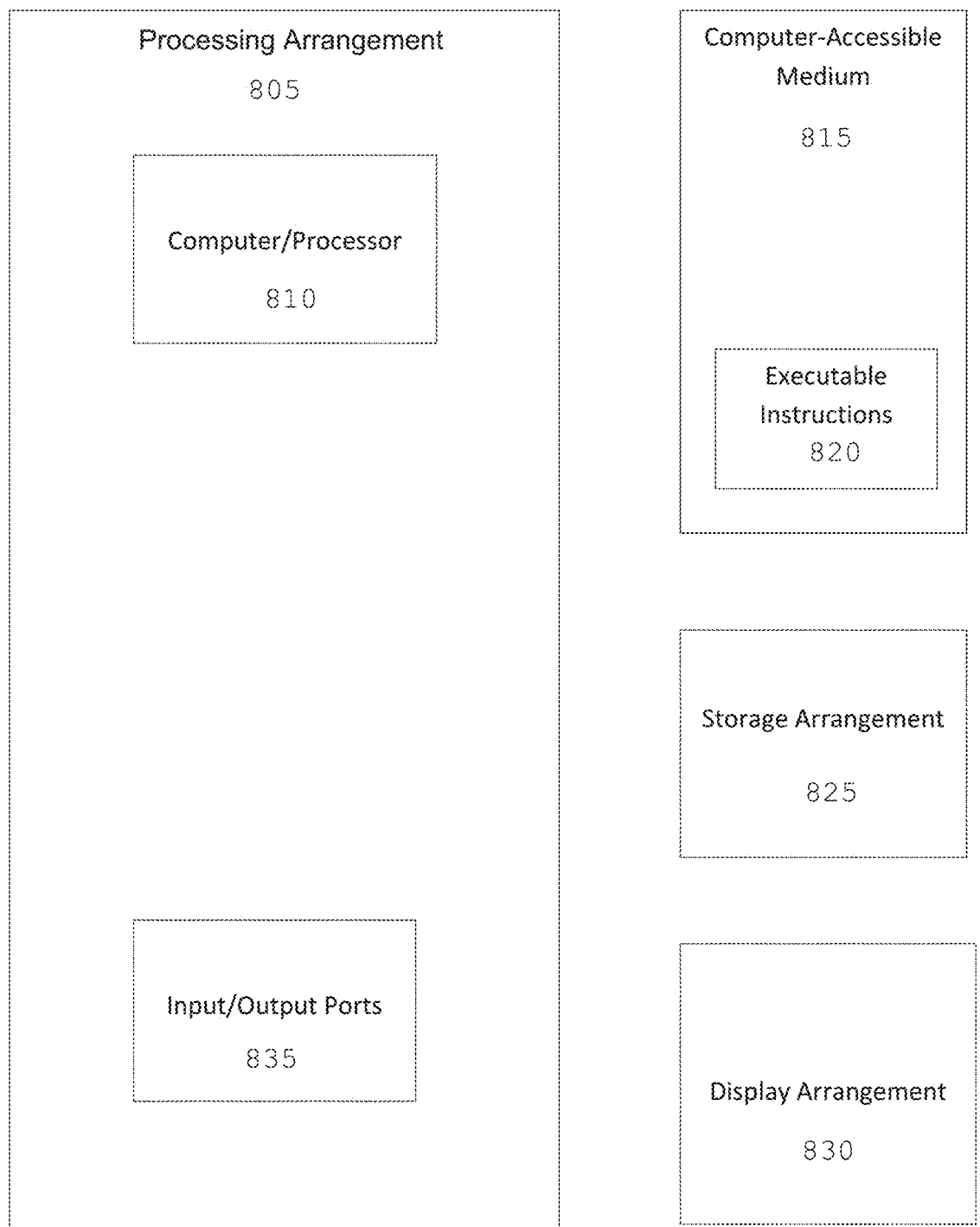
FIG. 8 is an illustration of an exemplary block diagram of an exemplary system in accordance with certain exemplary embodiments of the present disclosure.

FIG. 8 shows a block diagram of an exemplary embodiment of a system according to the present disclosure. For example, exemplary procedures in accordance with the present disclosure described herein may be performed by a processing arrangement and/or a computing arrangement 805. Such processing/computing arrangement 805 may be, for example, entirely, or a part of, or include, but not be limited to, a computer/processor 810 that may include, for example, one or more microprocessors, and use instructions stored on a computer-accessible medium (e.g., RAM, ROM, hard drive, or other storage device).

As shown in FIG. 8, for example, a computer-accessible medium 815 (e.g., as described herein above, a storage device such as a hard disk, floppy disk, memory stick, CD-ROM, RAM, ROM, etc., or a collection thereof) may be provided (e.g., in communication with the processing arrangement 805). The computer-accessible medium 815 may contain executable instructions 820 thereon. In addition, or alternatively, a storage arrangement 825 may be provided separately from the computer-accessible medium 815, which may provide the instructions to the processing arrangement 805 so as to configure the processing arrangement to execute certain exemplary procedures, processes, and methods, as described herein above, for example.

Further, the exemplary processing arrangement 805 may be provided with or include an input/output port 835, which may include, for example, a wired network, a wireless network, the internet, an intranet, a data collection probe, a sensor, etc. As shown in FIG. 8, the exemplary processing arrangement 805 may be in communication with an exemplary display arrangement 830, which, according to certain exemplary embodiments of the present disclosure, may be a touch-screen configured for inputting information to the processing arrangement in addition to outputting information from the processing arrangement, for example. Further, the exemplary display arrangement 830 and/or a storage arrangement 825 may be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and may be thus within the spirit and scope of the disclosure. Various different exemplary embodiments may be used together with one another, as well as interchangeably therewith, as should be understood by those having ordinary skill in the art. In addition, certain terms used in the present disclosure, including the specification, drawings, and claims thereof, may be used synonymously in certain instances, including, but not limited to, for example, data and information. It should be understood that, while these words, and/or other words that may be synonymous with one another, may be used synonymously herein, that there may be instances when such words may be intended to not be used synonymously. Further, to the extent that the prior art knowledge has not been explicitly incorporated by reference herein above, it is explicitly incorporated herein in its entirety. All publications referenced are incorporated herein by reference in their entireties.

What is claimed is:

1. A system comprising:
  a fuse control unit (FCU) coupled to a fuse array comprising a plurality of fuses, wherein the FCU is programmable based on an input characterizing a type of fuse array received at a test access method (TAM) interface of the FCU, wherein the input provides fuse location information identifying a fuse location of each fuse of the plurality of fuses; and
  a repair registration unit (RRU) coupled to the FCU and configured to:
    receive repair information identifying one or more errors in a memory based on an application of a memory test to the memory;
    receive the fuse location information in response to receiving the repair information; and
    repair the one or more errors in the memory based on the repair information and the fuse location information.

2. The system of claim 1, wherein the RRU is coupled to a memory built-in self-test (MBIST) unit, the MBIST unit configured to apply the memory test to the memory to test the memory for the one or more errors and communicate the repair information identifying the one or more errors in the memory to the RRU based on the memory test.

3. The system of claim 2, wherein the FCU is coupled to the RRU via a plurality of channels and is configured to provide the RRU with the fuse location information over the plurality of channels.

4. The system of claim 2, wherein the FCU is configured to provide the fuse location information to the RRU using a serial interface.

5. The system of claim 2, wherein the FCU is configured to provide the fuse location information to the RRU using a parallel interface.

6. The system of claim 1, wherein the RRU comprises a plurality of RRUs and the memory comprises a plurality of memories and each RRU is coupled to the FCU and to a respective memory of the plurality of memories and configured to receive a portion of the fuse location information to repair the respective memory.

7. The system of claim 6, wherein the plurality of RRUs are coupled in series with respect to one another.

8. The system of claim 1, wherein the TAM interface enables external control of the FCU to repair the one or more errors in the memory.

9. The system of claim 1, wherein the FCU comprises non-volatile storage element, wherein the FCU is configured to store the input as the fuse location information at the non-volatile storage element.

10. The system of claim 1, wherein the FCU comprises a memory, the FCU being configured to store the fuse location information in the memory, wherein the storing of the fuse location information in the memory is representative of programming the FCU based on the type of fuse array.

11. The system of claim 1, wherein the FCU is configured to:

receive the identified one or more errors in the memory and associate each identified error in the memory with a respective fuse of the plurality of fuses; and provide the fuse location information to the RRU for each fuse of the plurality of fuses associated with a respective error identified in the memory for use in repairing the respective error in the memory.

12. A method comprising:

receiving, at a test access method (TAM) interface of a fuse control unit (FCU), an input;

storing, in memory of the FCU, fuse location information identifying a fuse location of each fuse of a plurality of fuses of a fuse array characterized based on the input;

receiving, at a repair registration unit (RRU), repair information identifying one or more errors in a memory based on an application of a memory test to the memory;

receiving, at the RRU, the fuse location information from the FCU in response to receiving the repair information at the RRU; and repairing, using the RRU, the one or more errors in the memory based on the repair information and the fuse location information.

13. The method of claim 12, wherein the one or more errors are identified based on a built-in self-test, wherein the built-in self-test is the memory test.

14. The method of claim 12, wherein the fuse location information is stored in a non-volatile storage element coupled to the FCU.

15. The method of claim 12, wherein the memory comprises a plurality of memories and the RRU comprises a plurality of RRUs, each of the plurality of RRUs being associated with one of the plurality of memories.

16. The method of claim 15, wherein the plurality of RRUs are coupled in series to one another.

17. The method of claim 16, further comprising:

determining, using the plurality of RRUs, the one or more errors in a respective memory of the plurality of memories by applying a memory test to the respective memory;

providing, using the FCU, respective fuse location information identifying one or more locations in the fuse array to each RRU of the plurality of RRUs in response to determining the one or more errors in the respective memory; and repairing, using a respective RRU of the plurality of RRUs, the one or more errors in the respective memory of the plurality of memories based on the respective fuse location information and further based on repair information, the repair information being provided based on a respective memory test applied to the respective memory.

18. The method of claim 17, wherein the respective fuse location information provided to at least one RRU of the plurality of RRUs is shifted through at least one other RRU of the plurality of RRUs before being provided to the at least one RRU.

19. The method of claim 17, wherein the respective fuse location information provided to at least one RRU of the plurality of RRUs—is ring shifted through at least two other RRUs of the plurality of RRUs before being provided to the at least one RRU.

20. A system comprising:

a plurality of memories having one or more errors;

a plurality of repair registration units (RRUs), each RRU of the plurality of RRUs being coupled to one of the plurality of memories;

a fuse control unit (FCU) coupled to each of the RRUs and configured to communicate to each RRU respective fuse location information identifying a fuse location of one or more fuses of a fuse array; the respective fuse location information being provided based on an input received at a test access method (TAM) interface of the FCU; and wherein each RRU of the plurality of RRUs is configured to:

receive respective repair information identifying one or more errors in a respective memory of the plurality of memories identified based on an application of a respective memory test to the respective memory;

receive the respective fuse location information in response to receiving the respective repair information from the FCU; and repair the one or more errors identified in the respective memory of the plurality of memories based on the respective repair information and the respective fuse location information.

21. The system of claim 20, wherein the plurality of RRUs are coupled in series to one another.

22. The system of claim 21, wherein to communicate comprises shifting the fuse location information through the plurality of RRUs such that a portion of the fuse location information is received by a respective RRU of the plurality of RRUs, the portion of the fuse location information is the respective fuse location information.

23. The system of claim 20, wherein the FCU is programmable based on a type of fuse array.

* * * * *